(12) United States Patent
Ho

(10) Patent No.: US 11,158,378 B2
(45) Date of Patent: Oct. 26, 2021

(54) NON-VOLATILE MEMORY AND DATA WRITING METHOD THEREOF

(71) Applicant: Winbond Electronics Corp., Taichung (TW)

(72) Inventor: Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/820,739

(22) Filed: Mar. 17, 2020

(65) Prior Publication Data

US 2021/0082514 A1    Mar. 18, 2021

(30) Foreign Application Priority Data

Sep. 18, 2019 (TW) .................................. 108133705

(51) Int. Cl.
*G11C 16/10* (2006.01)
*G11C 16/14* (2006.01)

(52) U.S. Cl.
CPC .............. *G11C 16/10* (2013.01); *G11C 16/14* (2013.01)

(58) Field of Classification Search
CPC ...................................................... G11C 16/10
USPC ...................................................... 365/185.19
See application file for complete search history.

(56) References Cited

U.S. PATENT DOCUMENTS

| 5,784,315 | A | * | 7/1998 | Itoh | G11C 5/147 365/185.09 |
|---|---|---|---|---|---|
| 6,958,934 | B2 | | 10/2005 | Fan et al. | |
| 2006/0227645 | A1 | * | 10/2006 | Honda | G11C 16/3459 365/226 |
| 2012/0239858 | A1 | * | 9/2012 | Melik-Martirosian | G11C 16/12 711/103 |
| 2018/0090209 | A1 | * | 3/2018 | Hong | G11C 16/32 |

* cited by examiner

*Primary Examiner* — Min Huang
(74) *Attorney, Agent, or Firm* — JCIPRNET

(57) ABSTRACT

A non-volatile memory and a data writing method are provided. The non-volatile memory includes a memory array and a memory controller. The memory array has a plurality of memory cells. The memory controller is configured to perform a data write operation on a plurality of selected memory cells. In the data write operation, the memory controller records a total number of times that a data write pulse is supplied, compares the total number of times of the data write pulse to a preset threshold value to obtain an indication value, and adjusts an absolute value of a voltage of the data write pulse according to the indication value.

9 Claims, 6 Drawing Sheets

NON-VOLATILE MEMORY AND DATA WRITING METHOD THEREOF

CROSS-REFERENCE TO RELATED APPLICATION

This application claims the priority benefit of Taiwan application serial no. 108133705, filed on Sep. 18, 2019. The entirety of the above-mentioned patent application is hereby incorporated by reference herein and made a part of this specification.

BACKGROUND

Field of the Invention

The invention relates to a memory device and a data writing method thereof, and particularly relates to a non-volatile memory capable of improving service life and a data writing method thereof.

Description of Related Art

Regarding a non-volatile memory (for example, a flash memory), when the flash memory executes an erase operation and a program operation, a plurality of cycling operations of supplying pulses are required. For example, in the erase operation of the flash memory, one or a plurality of erase pulses may be supplied to a selected memory cell, and the erase operation may be accomplished by measuring a change of a threshold voltage of the selected memory cell. Similarly, in the program operation of the flash memory, one or a plurality of program pulses may be supplied to the selected memory cell, and the program operation may be accomplished by measuring a change of the threshold voltage of the selected memory cell.

However, after a plurality of the erase operation and the program operation, the memory cells of the flash memory may be deteriorated, such that the change of the threshold voltage is not as expected. In this case, when a data read operation is performed on the flash memory, a read margin may be inadequate such that interpretation error of read data occurs.

SUMMARY

The invention provides a non-volatile memory and a data writing method thereof, which are adapted to prolonging the service life of the memory and improve the correctness of read data.

The non-volatile memory of the invention includes a memory array and a memory controller. The memory array has a plurality of memory cells. The memory controller is coupled to the memory array. The memory controller is configured to perform a data write operation on a plurality of selected memory cells. In the data write operation, the memory controller records a total number of times that a data write pulse is supplied, compares the total number of times of the data write pulse with a preset threshold value to obtain an indication value, and adjusts a voltage absolute value of the data write pulse according to the indication value.

The data writing method of the non-volatile memory of the invention includes the following steps. A data write operation is performed on a plurality of selected memory cells. A total number of times that a data write pulse is supplied is recorded in the data write operation. The total number of times of the data write pulse is compared with a preset threshold value to obtain an indication value. A voltage absolute value of the data write pulse is adjusted according to the indication value.

Based on the above, the non-volatile memory of the invention may perform an adjustment action on the indication value according to the total number of times that the data write pulse is supplied and a variation state of a threshold voltage of the corresponding selected memory cell during the data write operation. The non-volatile memory adjusts the absolute value of the voltage of the data write pulse according to the indication value, and selects an appropriate voltage of the data write pulse according to a deterioration state of the selected memory cell to maintain a reading margin that may be provided by the non-volatile memory, so as to prolong the overall service life of the non-volatile memory and improve the correctness of read data.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
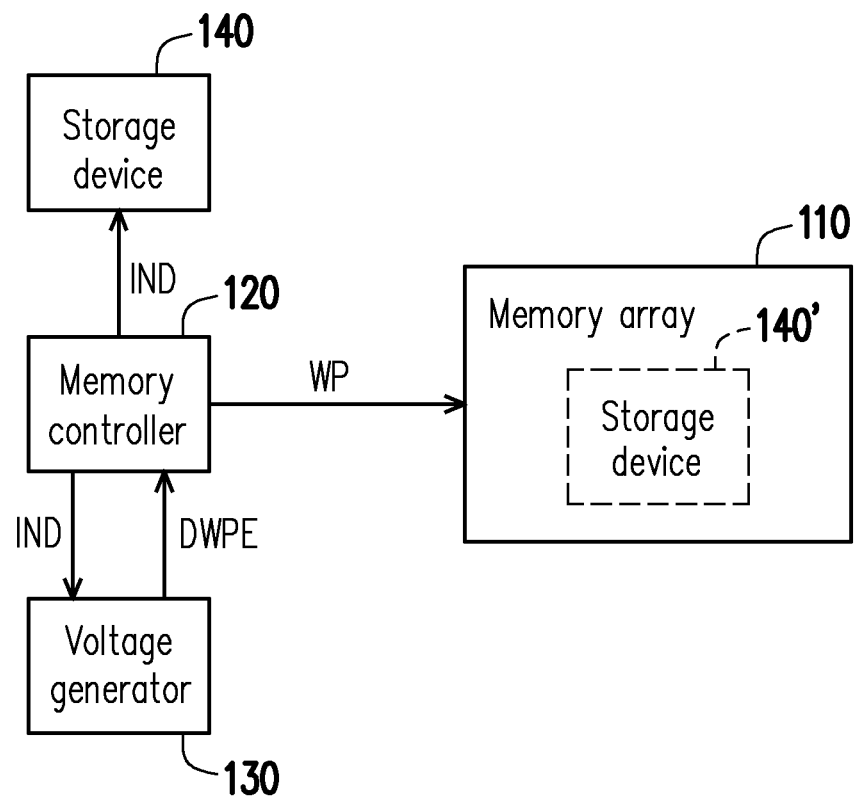
FIG. 1 is a schematic diagram of a non-volatile memory according to an embodiment of the invention.

FIG. 1 is a schematic diagram of a non-volatile memory 100 according to an embodiment of the invention. Referring to FIG. 1, in the present embodiment, the non-volatile memory 100 includes a memory array 110, a memory controller 120, a voltage generator 130, and a storage device 140. The memory array 110 has a plurality of memory cells. The memory controller 120 is coupled to the memory array 110 to perform a data write operation on a plurality of selected memory cells in a plurality of memory cells of the memory array 110.

Moreover, the voltage generator 130 is coupled to the memory controller 120. The voltage generator 130 is configured to generate a voltage DWPE of a data write pulse WP according to an indication value IND. The storage device 140 is coupled to the memory controller 120. The storage device 140 is configured to record the indication value IND, wherein the storage device 140 may be a non-volatile memory, but the invention is not limited thereto.

In detail, in the present embodiment, the indication value IND may be preset to an initial value. When the memory controller 120 performs the data write operation on the selected memory cells, the memory controller 120 may select one or a plurality of selected memory cells according to an address information and supply the data write pulse WP to the selected memory cells, wherein an absolute value of the voltage DWPE of the data write pulse WP may be set according to the indication value IND. Moreover, after the data write pulse WP is supplied, the memory controller 120 may measure a threshold voltage of the selected memory cells and compare the threshold voltage of the selected memory cells with a write verification voltage to verify whether the data write operation is completed.

Based on the above description, if the memory controller 120 determines that the data write operation is not completed, the memory controller 120 may again provide the data write pulse WP to be supplied to the selected memory cells and again measure the threshold voltage of the selected memory cells, and compare the threshold voltage of the selected memory cells with the write verification voltage to verify whether the data write operation is completed. Each supplying operation of the data write pulse WP and the action of verifying whether the data write operation is completed may form one data write verification cycle. It should be noted that the memory controller 120 may record number of executions of the data write verification cycle (i.e., a total number of times WT1 of the data write pulse WP).

The memory controller 120 may compare the total number of times WT1 with a preset threshold value N to obtain the indication value IND. In detail, if the total number of times WT1 is not greater than the preset threshold value N, the memory controller 120 may maintain a value magnitude of the indication value IND. In contrast, if the total number of times WT1 is greater than the preset threshold value N, the memory controller 120 adjusts the value magnitude of the indication value IND.

In an embodiment of the invention, when the total number of times WT1 is greater than the preset threshold value N, the selected memory cells have a certain degree of deterioration. Therefore, the memory controller 120 may adjust the value magnitude of the indication value IND, for example, increase the value of the indication value IND. It should be noted that the absolute value of the voltage DWPE of the data write pulse WP is set according to the indication value IND. Therefore, after the value of the indication value IND is increased, the absolute value of the voltage DWPE of the data write pulse WP subsequently supplied to the selected memory cells may also be correspondingly increased to maintain the data correctness of the selected memory cells.

It should be noted that in an embodiment of the invention, when the non-volatile memory 100 is operated in a program operation in the data write operation, the data write pulse WP supplied to the selected memory cells by the memory controller 120 may be a program pulse PP, and the indication value IND may be a program indication value PIND. When the non-volatile memory 100 is operated in an erase operation in the data write operation, the data write pulse WP supplied to the selected memory cells by the memory controller 120 may be an erase pulse EP, and the indication value IND may be an erase indication value EIND.

It should be noted that the storage device 140 of the present embodiment may be disposed outside the memory array 110, or disposed inside the memory array 110 (shown as a storage device 140' of FIG. 1). In particular, in the present embodiment, the storage device 140 disposed outside the memory array 110 is taken as an example for description.

According to the description of the embodiment of FIG. 1, the non-volatile memory 100 of the present embodiment may adjust the indication value IND stored in the storage device 140 through the memory controller 120 according to the total number of times WT1 that the data write pulse WP is supplied and a variation state of the threshold voltage of the selected memory cells. In particular, when it is determined that the selected memory cells are in a deteriorated state (for example, the total number of times WT1 is greater than the preset threshold value N), the voltage generator 130 may increase the absolute value of the voltage DWPE of the data write pulse WP according to the adjusted indication value IND. In this way, in the subsequent data write operation, the memory controller 120 may supply the data write pulse WP with the increased voltage DWPE to the selected memory cells, so as to maintain a read margin that may be provided by the non-volatile memory 100, thus prolonging the overall service life of the non-volatile memory 100 and improving correctness of the read data.

Figure 2:
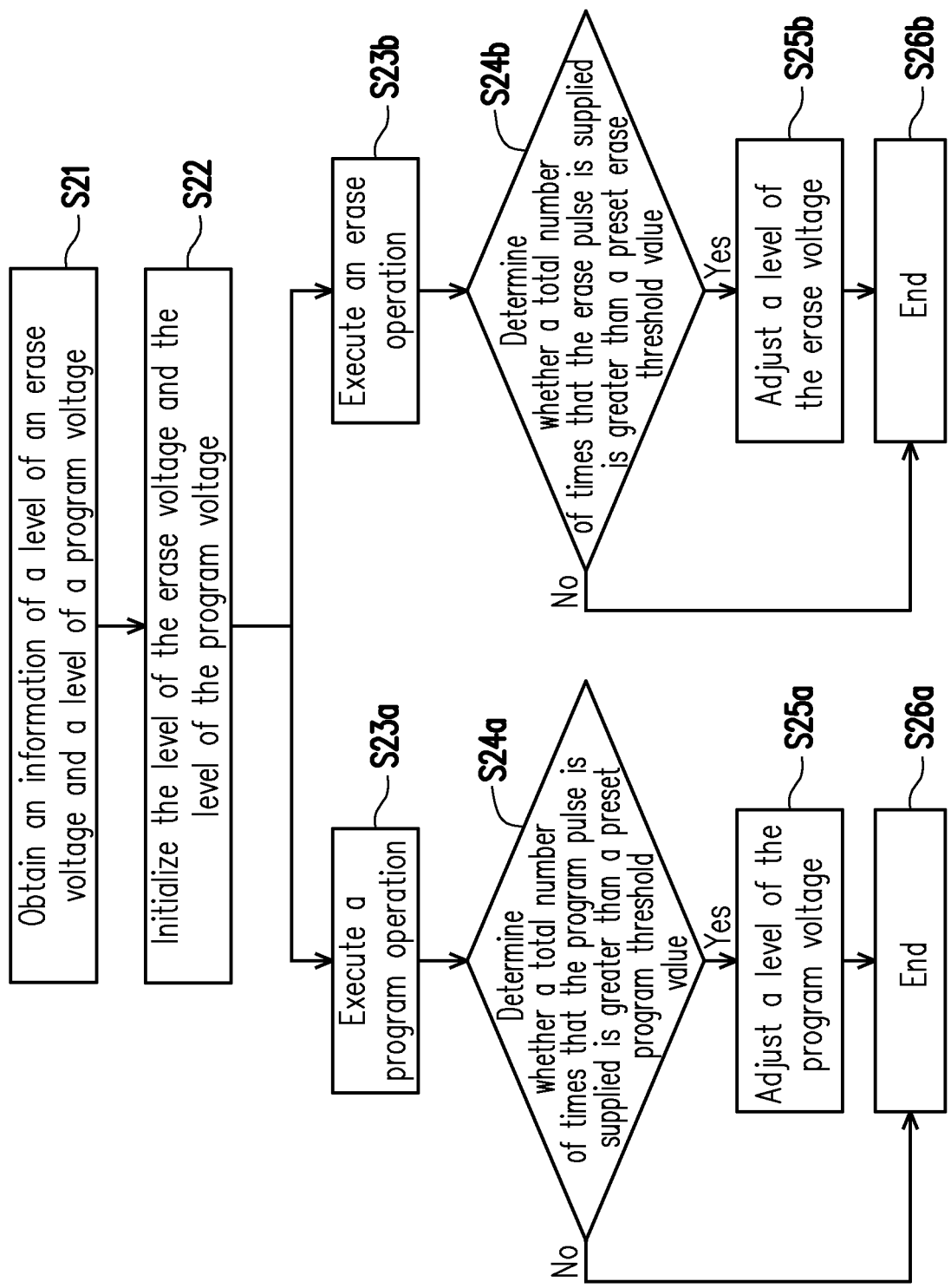
FIG. 2 is an operation flowchart of an erase operation and a program operation according to an embodiment of the invention.

FIG. 2 is an operation flowchart of an erase operation and a program operation according to an embodiment of the invention. FIG. 3A to FIG. 3E are waveform diagrams corresponding to each step shown in FIG. 2 according to an embodiment of the invention. In particular, the data write operation of the present embodiment may include an erase operation and a program operation.

Figure 3A:
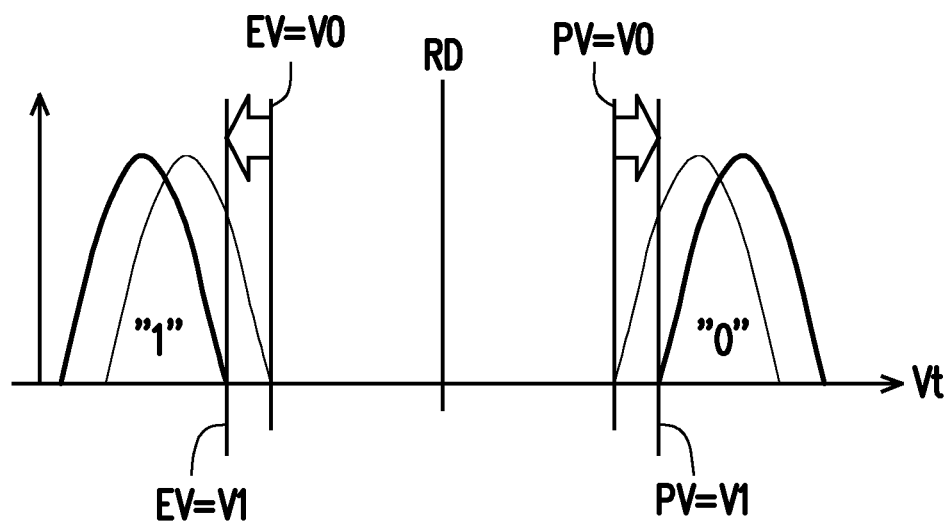
FIG. 3A to FIG. 3E are waveform diagrams corresponding to each step shown in FIG. 2 according to an embodiment of the invention.

Referring to FIG. 1, FIG. 2, and FIG. 3A for implementation details of the non-volatile memory 100. In step S21, the memory controller 120 may select one or a plurality of selected memory cells from the memory array 110 according to an address information, so as to obtain information of a level EV of an erase voltage and a level PV of a program voltage corresponding to the selected memory cells. Namely, in step S21, the memory controller 120 may obtain related information that the level EV of the erase voltage of the selected memory cells is preset to a voltage V0 and the level PV of the program voltage of the selected memory cells is preset to the voltage V0 from the memory array 110.

Figure 3B:
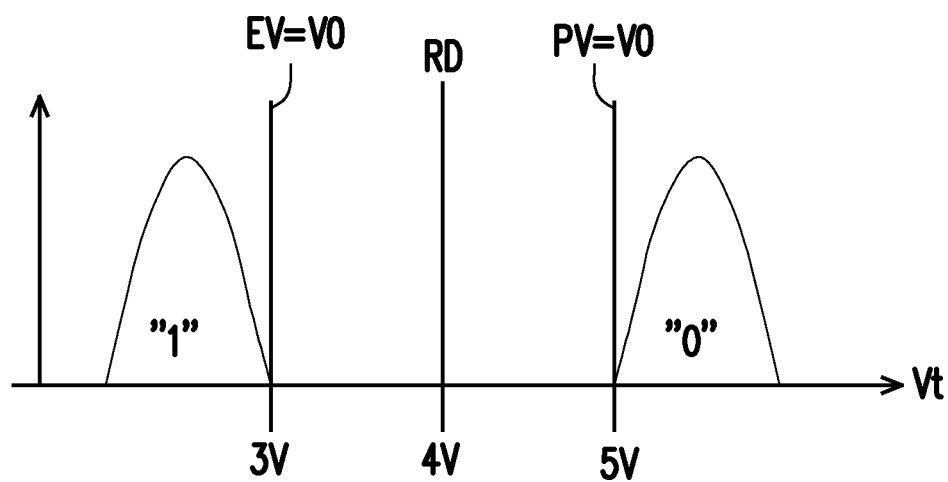

Then, referring to FIG. 1, FIG. 2, and FIG. 3B, in step S22, the memory controller 120 may perform an initialization action on the level EV of the erase voltage and the level PV of the program voltage corresponding to the selected memory cells. For example, the memory controller 120 may initialize a voltage value corresponding to the level EV of the erase voltage to 3V, initialize a voltage value corresponding to the level PV of the program voltage to 5V, and initialize a voltage value of a read voltage RD of the non-volatile memory 100 to 4V. In particular, each of the above voltage values is only an example, and the embodiments of the invention are not limited to the aforementioned voltage values.

Then, referring to FIG. 1, FIG. 2, FIG. 3C, and FIG. 4, in step S23a, the memory controller 120 may perform a program operation on the selected memory cells. In detail, in the program operation, the memory controller 120 may supply the program pulse PP to the selected memory cells, wherein an absolute value of the voltage DWPE of the program pulse PP may be set according to the program indication value PIND.

Figure 4:
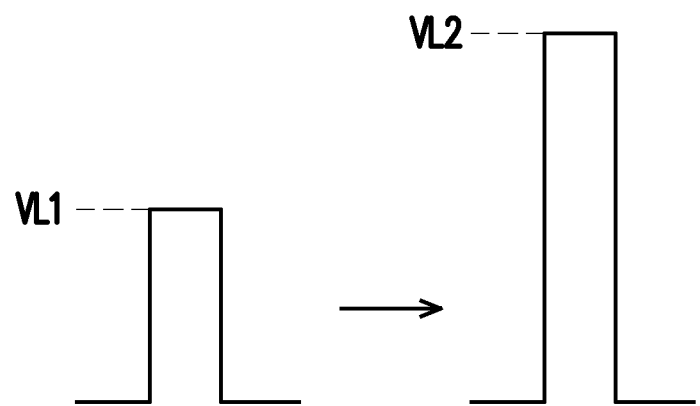
FIG. 4 is a schematic diagram of an erase pulse and a program pulse according to an embodiment of the invention.

For example, as shown in FIG. 4, the memory controller 120 may generate the voltage DWPE with a first voltage level VL1 through the voltage generator 130, so that the memory controller 120 may supply the program pulse PP with the first voltage level VL1 to the selected memory cells. Moreover, after the program pulse PP is supplied, the memory controller 120 may measure a threshold voltage Vt of the selected memory cells and compare the threshold voltage Vt of the selected memory cells with a program verification voltage to verify whether the program operation is completed.

Figure 3C:
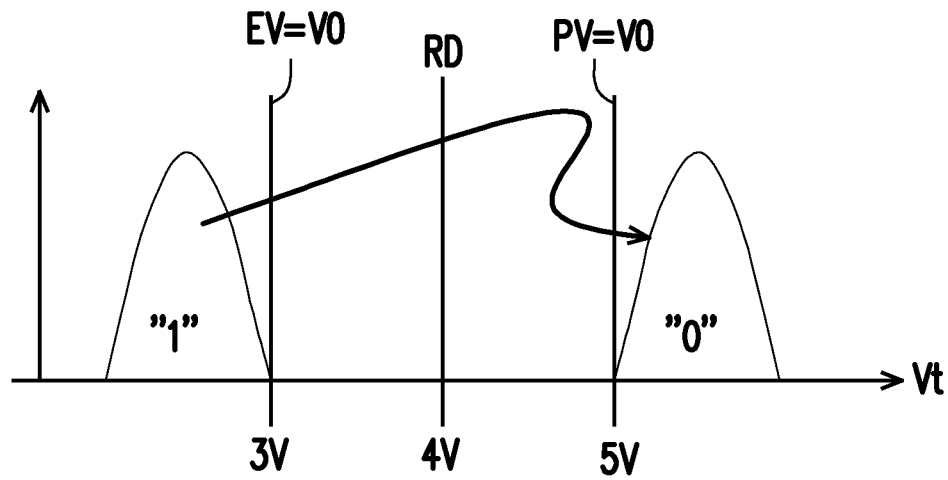

In particular, referring to FIG. 3C for the operation action of measuring the threshold voltage Vt of the selected memory cells, when the non-volatile memory 100 executes the program operation, the memory controller 120 may program the selected memory cells with a relatively low threshold voltage Vt into memory cells with a relatively high threshold voltage Vt. The selected memory cells may be regarded as memory cells storing data of logic 0.

It should be noted that in step S23a, if the memory controller 120 determines that the program operation is not completed, the memory controller 120 may again provide the program pulse PP to be supplied to the selected memory cells and again measure the threshold voltage Vt of the selected memory cells and compare the threshold voltage Vt of the selected memory cells with the program verification voltage to verify whether the program operation is completed.

It should be noted that each supplying action of the program pulse PP and the action of verifying whether the program operation is completed may form one program verification cycle. The memory controller 120 may record a number of executions of the program verification cycle (i.e. a total number of times WT2 of the program pulse PP) to the storage device 140.

Then, referring to FIG. 1 and FIG. 2, in step S24a, the memory controller 120 may determine whether the total number of times WT2 of supplying the program pulse PP is greater than a preset program threshold value NP. To be specific, the memory controller 120 may compare the total number of times WT2 with the preset program threshold value NP to obtain a program indication value PIND. Moreover, when the memory controller 120 determines that the total number of times WT2 is not greater than the preset program threshold value NP, the memory controller 120 may execute step S26a to end the operation action of step S24a and maintain a value magnitude of the program indication value PIND. Comparatively, when the memory controller 120 determines that the total number of times WT2 is greater than the preset program threshold value NP, the memory controller 120 may execute step S25a to adjust the value magnitude of the program indication value PIND.

It should be noted that in the program operation of an embodiment of the invention, when the total number of times WT2 is greater than the preset program threshold value NP, the selected memory cells are deteriorated to a certain degree.

As the non-volatile memory 100 is deteriorated, the memory controller 120 may execute the operation action of step S25a after step S24a. Referring to FIG. 1, FIG. 2, FIG. 3E, and FIG. 4, in step S25a, the memory controller 120 may adjust the value magnitude of the program indication value PIND to adjust the level PV of the program voltage. For example, the memory controller 120 may increase the value magnitude of the program indication value PIND by one offset value according to a determination result of step S24a. Further, the memory controller 120 may store the adjusted program indication value PIND to the storage device 140 to update the preset initial value. Then, the memory controller 120 may increase the level PV of the program voltage from the original voltage V0 to a voltage V1 according to the program indication value PIND increased by one offset value.

Moreover, since the absolute value of the voltage DWPE of the program pulse PP is set according to the program indication value PIND, as shown in FIG. 4, after the program indication value PIND is increased by one offset value, the memory controller 120 may increase the voltage DWPE to a second voltage level VL2 through the voltage generator 130 according to the adjusted program indication value PIND, such that the memory controller 120 may supply the program pulse PP with the second voltage level VL2 to the selected memory cells, so as to maintain the data correctness of the selected memory cells.

It should be noted that in some other embodiments of the invention, the memory controller 120 may also increase the value magnitude of the program indication value PIND by two or a plurality of offset values according to the determination result of step S24a. In this way, the memory controller 120 may further increase the absolute value of the voltage DWPE of the program pulse PP by increasing the value magnitude of the program indication value PIND.

In this way, when the selected memory cells are deteriorated in the program operation, the memory controller 120 of the present embodiment may increase the value magnitude of the program indication value PIND according to the total number of times WT2 that the program pulse PP is supplied and a variation state of the threshold voltage Vt of the corresponding selected memory cells and accordingly increase the absolute value of the voltage DWPE of the program pulse PP, so as to effectively maintain the read margin that may be provided by the non-volatile memory 100 to accordingly prolong the overall service life of the non-volatile memory 100 and improve the correctness of read data.

Moreover, referring to FIG. 1, FIG. 2, FIG. 3D, and FIG. 4, in step S23b, the memory controller 120 may perform an erase operation on the selected memory cells. In detail, in the erase operation, the memory controller 120 may supply an erase pulse EP to the selected memory cells, wherein an absolute value of the voltage DWPE of the erase pulse EP may be set according to the erase indication value EIND.

For example, as shown in FIG. 4, the memory controller 120 may generate the voltage DWPE with the first voltage level VL1 through the voltage generator 130, so that the memory controller 120 may supply the erase pulse EP with the first voltage level VL1 to the selected memory cells. Moreover, after the erase pulse EP is supplied, the memory controller 120 may measure the threshold value Vt of the selected memory cells and compare the threshold value Vt of the selected memory cells with an erase verification voltage to verify whether the erase operation is completed.

Figure 3D:
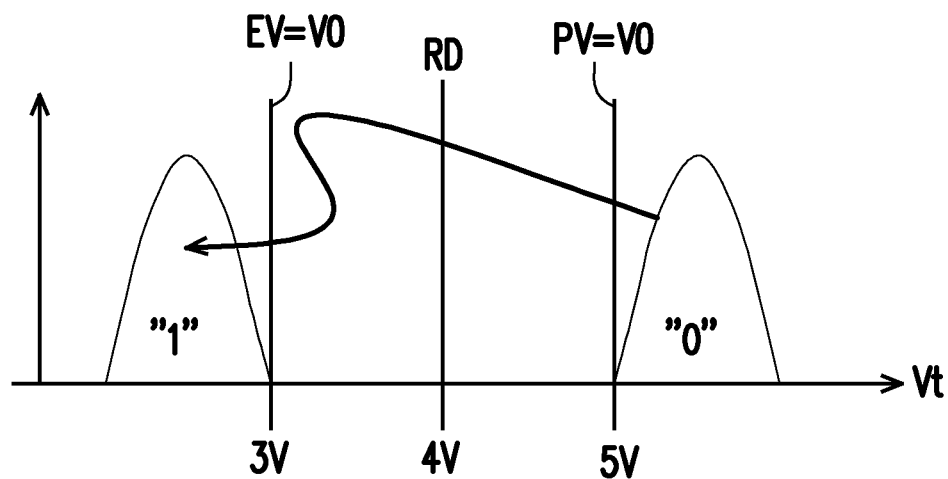
Figure 3E:
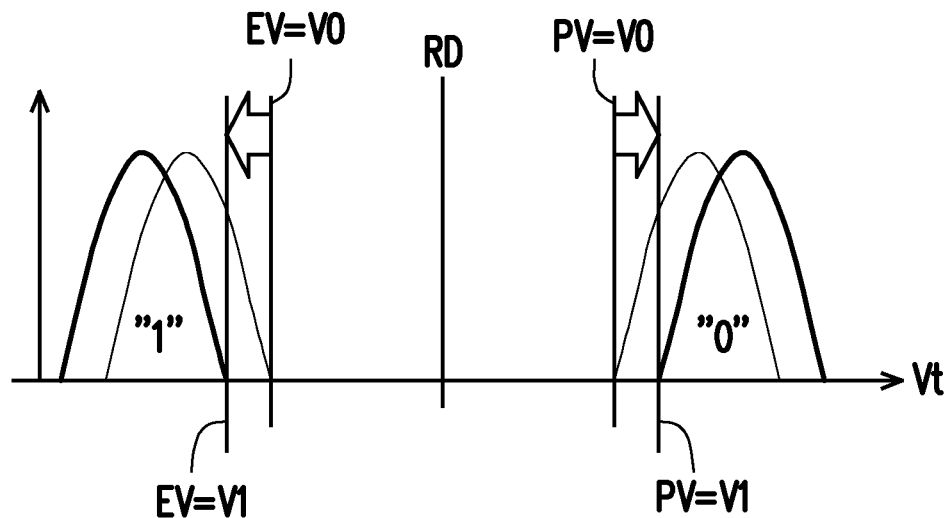

In particular, referring to FIG. 3D for the operation action of measuring the threshold voltage Vt of the selected memory cells, when the non-volatile memory 100 executes the erase operation, the memory controller 120 may erase the selected memory cells with a relatively high threshold voltage Vt into memory cells with a relatively low threshold voltage Vt. Here, the selected memory cells may be regarded as memory cells storing data of logic 1.

It should be noted that in step S23b, if the memory controller 120 determines that the erase operation is not completed, the memory controller 120 may again provide the erase pulse EP to be supplied to the selected memory cells, and again measure the threshold voltage Vt of the selected memory cells, and compare the threshold voltage Vt of the selected memory cells with the erase verification voltage to verify whether the erase operation is completed.

It should be noted that each supplying operation of the erase pulse EP and the action of verifying whether the erase operation is completed may form one erase verification cycle. In particular, the memory controller 120 may record the number of executions of the erase verification cycles (i.e., a total number of times WT3 of the erase pulse EP) to the storage device 140.

Then, referring to FIG. 1 and FIG. 2, in step S24b, the memory controller 120 may determine whether the total number of times WT3 of supplying the erase pulse EP is greater than a preset erase threshold value NE. To be specific, the memory controller 120 may compare the total number of times WT3 with the preset program threshold value NE to obtain the erase indication value EIND. Moreover, when the memory controller 120 determines that the total number of times WT3 is not greater than the preset erase threshold value NE, the memory controller 120 may execute step S26b to end the operation action of step S24b and maintain the value magnitude of the erase indication value EIND. Comparatively, when the memory controller 120 determines that the total number of times WT3 is greater than the preset erase threshold value NE, the memory controller 120 may execute step S25b to adjust the value magnitude of the erase indication value EIND.

It should be noted that in the erase operation of an embodiment of the invention, when the total number of times WT3 is greater than the preset erase threshold value NE, the selected memory cells are deteriorated to a certain degree.

As the non-volatile memory 100 is deteriorated, the memory controller 120 may execute the operation action of step S25b after step S24b. Referring to FIG. 1, FIG. 2, FIG. 3E, and FIG. 4, in step S25b, the memory controller 120 adjusts the value magnitude of the erase indication value EIND to adjust the level EV of the erase voltage. For example, the memory controller 120 may increase the value magnitude of the erase indication value EIND by one offset value according to a determination result of step S24b. Further, the memory controller 120 may store the adjusted erase indication value EIND to the storage device 140 to update the preset initial value. Then, the memory controller 120 may increase the level EV of the erase voltage from the original voltage V0 to the voltage V1 according to the erase indication value EIND increased by one offset value.

Moreover, since the absolute value of the voltage DWPE of the erase pulse EP is set according to the erase indication value EIND, as shown in FIG. 4, after the erase indication value EIND is increased by one offset value, the memory controller 120 may increase the voltage DWPE to the second voltage level VL2 through the voltage generator 130 according to the adjusted erase indication value EIND, such that the memory controller 120 may supply the erase pulse EP with the second voltage level VL2 to the selected memory cells, so as to maintain the data correctness of the selected memory cells.

It should be noted that in some other embodiments of the invention, the memory controller 120 may also increase the value magnitude of the erase indication value EIND by two or a plurality of offset values according to the determination result of step S24b. In this way, the memory controller 120 may further increase the absolute value of the voltage DWPE of the erase pulse EP by increasing the value magnitude of the erase indication value EIND.

In this way, when the selected memory cells are deteriorated in the erase operation, the memory controller 120 of the present embodiment may increase the value magnitude of the erase indication value EIND according to the total number of times WT3 that the erase pulse EP is supplied and a variation state of the threshold voltage Vt of the corresponding selected memory cells, and accordingly increase the absolute value of the voltage DWPE of the erase pulse EP, so as to effectively maintain the read margin that may be provided by the non-volatile memory 100 to accordingly prolong the overall service life of the non-volatile memory 100 and improve correctness of read data.

It should be noted that the threshold values N, NP, NE and the total number of times WT1, WT2, WT3 in the aforementioned embodiments may be adjusted according to a design requirement of the non-volatile memory 100, and the invention is not limited to the specific values. In particular, the preset threshold values N, NP, NE may be respectively set according to increased offset values of the indication value IND, the program indication value PIND, and the erase indication value EIND.

Figure 5:
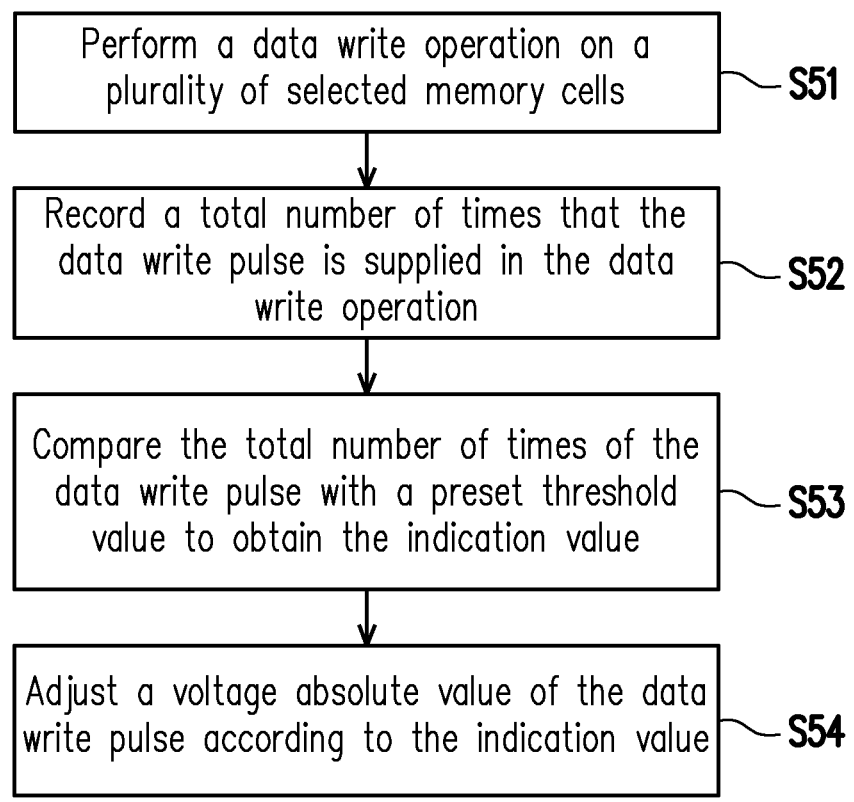
FIG. 5 is a flowchart of a data writing method of a non-volatile memory according to an embodiment of the invention.

FIG. 5 is a flowchart of a data writing method of the non-volatile memory 100 according to an embodiment of the invention. Referring to FIG. 1 and FIG. 5, in step S51, the memory controller 120 may perform a data write operation on a plurality of selected memory cells. In step S52, in the data write operation, the memory controller 120 may record a total number of times that the data write pulse WP is supplied. In step S53, the memory controller 120 may compare the total number of times of the data write pulse WP with a preset threshold value N to obtain the indication value IND. In step S54, the memory controller 120 may adjust an absolute value of the voltage DWPE of the data write pulse WP according to the indication value IND.

Implementation details of each step of the invention have been described in detail in the aforementioned embodiments, which are not repeated herein.

Based on the above, the non-volatile memory of the invention may perform an adjustment action of the program indication value (or erase indication value) according to the total number of times that the program pulse (or erase pulse) is supplied and a variation state of the threshold voltage of the corresponding selected memory cells during the program operation (or erase operation). The non-volatile memory adjusts the absolute value of the voltage of the program pulse (or erase pulse) according to the program indication value (or erase indication value) and selects an appropriate voltage of the program pulse (or erase pulse) in response to the deterioration state of the selected memory cells to maintain a reading margin that may be provided by the non-volatile memory, so as to prolong the overall service life of the non-volatile memory and improve the correctness of read data.

It will be apparent to those skilled in the art that various modifications and variations may be made to the disclosed embodiments without departing from the scope or spirit of the invention. In view of the foregoing, it is intended that the invention covers modifications and variations provided they fall within the scope of the following claims and their equivalents.

What is claimed is:

1. A data writing method of a non-volatile memory, comprising:
    performing a first data write operation on a plurality of selected memory cells;
    recording a total number of times that a data write pulse is supplied in the first data write operation;
    comparing a threshold voltage of the plurality of selected memory cells with a write verification voltage to verify whether the first data write operation is completed;
    comparing the total number of times of the data write pulse with a preset threshold value to obtain an indication value;
    adjusting a voltage absolute value of the data write pulse according to the indication value;

increasing the indication value by an offset value according to the total number of times of the data write pulse and a variation state of the threshold voltage of the plurality of selected memory cells;

storing adjusted the indication value to a storage device; and reading adjusted the indication value by the storage device when performing a second data write operation on the plurality of selected memory cells, and the voltage absolute value of the data write pulse is adjusted according to adjusted the indication value to perform the second data write operation, wherein the second data write operation occurs after the first data write operation.

2. The data writing method as claimed in claim 1, wherein the step of comparing the total number of times of the data write pulse with the preset threshold value to obtain the indication value comprises:

adjusting the indication value when the total number of times of the data write pulse is greater than the threshold value; and increasing the voltage absolute value of the data write pulse according to the indication value.

3. The data writing method as claimed in claim 1, wherein when the first data write operation is an erase operation, the data writing method further comprises:

recording a total number of times that an erase pulse is supplied;

comparing the total number of times of the erase pulse and a preset erase threshold value to obtain an erase indication value; and adjusting a voltage absolute value of the erase pulse according to the erase indication value.

4. The data writing method as claimed in claim 3, wherein the step of comparing the total number of times of the erase pulse and the preset erase threshold value to obtain the erase indication value comprises:

adjusting the erase indication value when the total number of times of the erase pulse is greater than the erase threshold value; and increasing the voltage absolute value of the erase pulse according to the erase indication value.

5. The data writing method as claimed in claim 4, wherein the step of adjusting the erase indication value when the total number of times of the erase pulse is greater than the erase threshold value comprises:

increasing the erase indication value by an offset value.

6. The data writing method as claimed in claim 1, wherein when the first data write operation is a program operation, the data writing method further comprises:

recording a total number of times that a program pulse is supplied;

comparing the total number of times of the program pulse and a preset program threshold value to obtain a program indication value; and adjusting a voltage absolute value of the program pulse according to the program indication value.

7. The data writing method as claimed in claim 6, wherein the step of comparing the total number of times of the program pulse and the preset program threshold value to obtain the program indication value comprises:

adjusting the program indication value when the total number of times of the program pulse is greater than the program threshold value; and increasing a voltage absolute value of the program pulse according to the program indication value.

8. The data writing method as claimed in claim 7, wherein the step of adjusting the program indication value when the total number of times of the program pulse is greater than the program threshold value comprises:

increasing the program indication value by an offset value.

9. The data writing method as claimed in claim 1, wherein the step of performing the first data write operation on the plurality of selected memory cells comprises:

selecting the plurality of selected memory cells according to an address information.

* * * * *